United States Patent [19]

Heid

[11] Patent Number: 5,668,474
[45] Date of Patent: Sep. 16, 1997

[54] METHOD IN THE FORM OF A PULSE SEQUENCE FOR FAST NUCLEAR MAGNETIC RESONANCE IMAGING

[75] Inventor: Oliver Heid, Bern, Switzerland

[73] Assignee: Siemens Aktiengesellschaft, Munich, Germany

[21] Appl. No.: 673,113

[22] Filed: Jul. 1, 1996

[30] Foreign Application Priority Data

Jul. 3, 1995 [DE] Germany ............... 195 24 184.3

[51] Int. Cl.⁶ .................................................. G01V 3/00
[52] U.S. Cl. ........................................ 324/309; 324/307
[58] Field of Search ............................. 324/309, 307, 324/312, 314, 300

[56] References Cited

U.S. PATENT DOCUMENTS

| | | |
|---|---|---|
| 4,707,658 | 11/1987 | Frahm et al. . |
| 4,769,603 | 9/1988 | Oppelt et al. . |
| 5,270,654 | 12/1993 | Feinberg et al. .................. 324/309 |
| 5,337,000 | 8/1994 | Bruder . |
| 5,361,028 | 11/1994 | Kanayama et al. ............... 324/309 |
| 5,561,370 | 10/1996 | Fuderer .......................... 324/309 |
| 5,565,777 | 10/1996 | Kanayama et al. ............... 324/309 |

FOREIGN PATENT DOCUMENTS 0 076 054   10/1982   European Pat. Off. .

*Primary Examiner*—Louis M. Arana
*Attorney, Agent, or Firm*—Hill, Steadman & Simpson

[57] ABSTRACT

Radiofrequency pulses are emitted to the examination subject with a repetition time that is shorter than the spin grid relaxation time and that is also dimensioned such that the phase deviation between nuclear spins in the examination volume due to magnetic field inhomogeneities is less than 180°. A readout gradient with sub-pulses with changing polarity is activated between two radiofrequency pulses and a nuclear magnetic resonance signal in the form of an echo arises under each sub-pulse. All gradients activated between two successive radiofrequency pulses comprise a gradient-time integral equal to zero.

6 Claims, 2 Drawing Sheets

METHOD IN THE FORM OF A PULSE SEQUENCE FOR FAST NUCLEAR MAGNETIC RESONANCE IMAGING

BACKGROUND OF THE INVENTION

1. Field of the Invention

The present invention is directed to a method for obtaining an image in a nuclear magnetic resonance tomography apparatus, and in particular to a method in the form of a pulse sequence for rapidly acquiring the data for generating such an image.

2. Description of the Prior Art

Essentially three methods for fast imaging are known in nuclear magnetic resonance tomography, namely the FLASH method, the FISP method and the echo planar method, each with respective versions thereof.

The FLASH method, for example, is described in U.S. Pat. No. 4,707,658. Gradient echoes having small flip angles of the radiofrequency pulse and repetition times that are significantly shorter than the spin grid relaxation times of the nuclear spins under investigation are thereby generated. In this method, the flip angles are selected as the repetition times become shorter, i.e. the faster the pulse sequence becomes. The signal-to-noise ratio also drops with the diminution of the flip angles.

In an especially fast version of the FLASH method, what is referred to as the turbo-FLASH method, with extremely short repetition times, the magnetization is inverted before each measuring sequence in order to prevent the T1 contrast from collapsing. As a result of the necessary spin inversion, however, one must wait for an equilibrium of the spins to be established for every new measuring sequence. A continuous measurement in dynamic equilibrium is therefore not possible.

The FISP method, which is disclosed in detail in U.S. Pat. No. 4,769,603, likewise represents a fast gradient echo method wherein—by contrast to the FLASH method—the phase encoding is reset before every radiofrequency pulse.

In practice, however, a version of the FISP method has hitherto prevailed wherein no complete rephasing of the nuclear spins ensues in at least one spatial direction. In sequences with complete rephasing, which are also referred to as "true FISP", black stripes appear in the image given longer repetition times if especially high magnetic field homogeneity is not present.

What is referred to as the echo planar imaging (EPI) method, as disclosed in European Application 0 076 054, is even faster than the FLASH method or FISP method. At the beginning of the pulse sequence, an RF excitation pulse is emitted to an examination subject under the influence of a slice selection gradient in a first direction. Nuclear spins are thereby excited in a slice of the examination subject. After the excitation, a phase-encoding gradient is activated in a second direction and a readout gradient is activated in a third direction. The first, second and third directions reside perpendicularly to one another. The readout gradient is composed of a pre-phasing pulse as well as of sub-pulses with changing (alternating) polarity. As a result of this changing polarity of the readout gradient, the nuclear spins are dephased and rephased in alternation, so that a sequence of nuclear magnetic resonance signals arises. So many signals are thereby acquired after a single excitation that the entire Fourier k-space is sampled, i.e. the existing information suffices for the reconstruction of a complete tomogram.

The nuclear magnetic resonance signals are phase-encoded, sampled in the time domain, digitized, and the numerical values acquired in this way are entered into a raw data matrix. An image of the examination subject is then reconstructed from this raw data matrix on the basis of a two-dimensional Fourier transformation.

The speed advantage of the EP method is essentially due to the acquisition of a number of signals that is sufficient for the reconstruction of a complete tomogram after a single excitation. All signals, which ultimately represent gradient echoes, must be acquired within the T2* decay. The readout gradient must therefore be very rapidly switched in a bipolar manner, which results in hardware demands which are considerable.

A method wherein the advantages of the echo planar method are combined with the advantages of the EPI method to a certain extent is disclosed in U.S. Pat. No. 5,337,000. Radiofrequency pulses are thereby emitted with a repetition time that is shorter than the spin grid relaxation time. A number of echoes is acquired after every radiofrequency pulse on the basis of a readout gradient that multiply changes in polarity. Differing from the "true FISP" method disclosed in the above-cited U.S. Pat. No. 4,769,603, however, a rephasing of the spins does not ensue in all spatial directions. On the contrary, the slice selection gradient, for example, is not symmetrical relative to the allocated radiofrequency pulse, so that this pulse sequence is not rephased, at least with respect to the slice selection direction.

An article entitled, "3D Steady State Echo Planar Imaging" by A. N. Abduljalil et al., SMRM Abstracts 1994, page 472, describes a similar method for 3D imaging. A complete rephasing in all spatial directions, i.e. a true FISP method, was, however, not applied. Given the repetition times of 54 ms or 108 ms recited therein, the phases of the nuclear magnetic resonance signals from different spatial regions would diverge to such an extent given a true FISP method that a pronounced signal modulation would occur. Stripes in the image that are not tolerable in practice would arise therefrom. This is avoided in the standard FISP method because that gradients are not rephased in at least one direction.

SUMMARY OF THE INVENTION

An object of the invention is to provide a magnetic resonance imaging method, in the form of a pulse sequence, which combines the advantages of the true FISP method with the speed advantages of the EPI method.

The inventive method is in the form of a pulse sequence wherein nuclear spins, after being aligned in a predetermined direction by a uniform magnetic field, are excited by successive radiofrequency pulses, each radiofrequency pulse having a repetition time which is shorter than the spin grid relaxation time, and the repetition time also being dimensioned so that the phase difference between nuclear spins in the examination volume due to magnetic field inhomogeneities within a repetition time is maintained smaller than 180°. At least a readout gradient, composed of a plurality of sub-pulses with alternating polarity, is generated between two successive radiofrequency pulses, and a nuclear magnetic resonance signal in the form of an echo arises under each sub-pulse and at least a portion of these nuclear magnetic resonance signals is read out in readout intervals. The readout gradient, plus any other gradients which may be activated between two successive radiofrequency pulses, such as a slice selection gradient or a phase-encoding gradient, have a gradient time integral of zero.

This combined method has the advantages over true FISP that the sum of the readout times per repetition time is higher, and a better signal-to-noise ratio with reference to the measuring time is thus achieved compared to true FISP, i.e. the method is more efficient.

The acquisition of an image proceeds faster since the dead times are lower as a percentage.

Given the same gradient system, the method is about as fast as EPI; due to the shorter pulse train after every excitation, however, it has fewer fat-water problems. These result from the phase difference between fat signals and water signals due to the different resonant frequencies of the respective protons.

Due to the incorporation of the true FISP method, nearly twice the signal is achieved and flux artifacts become fewer compared to the standard FISP method.

DESCRIPTION OF THE PREFERRED EMBODIMENTS

Figure 1:
FIG. 1 shows the radiofrequency pulses RF employed in the inventive method.

According to FIG. 1, a sequence of radiofrequency pulses RF is emitted to the examination subject with the repetition time TR. As in all steady state sequences, the repetition time RF is shorter than the spin grid relaxation time of the excited spins. In order to avoid the problems with the signal modulation described above and the stripes in the image that arise as a result, another condition must be met. Within a repetition time, the phase differences within the observation window resulting from basic field inhomogeneities must remain below 180°. According to the prior art, the basic magnetic field can be balanced such that it has a deviation of a maximum of 5 ppm within the examination volume. Given a magnetic field strength of, for example, 1 T, this corresponds to a frequency deviation of 50 Hz. The aforementioned condition (phase deviation<180°) is thus met when the repetition time is shorter than 10 ms.

As is standard in steady state sequences, the flip angle $\alpha$ for the radiofrequency pulses RF is selected smaller than 90° for optimizing the signal amplitude.

Figure 2:
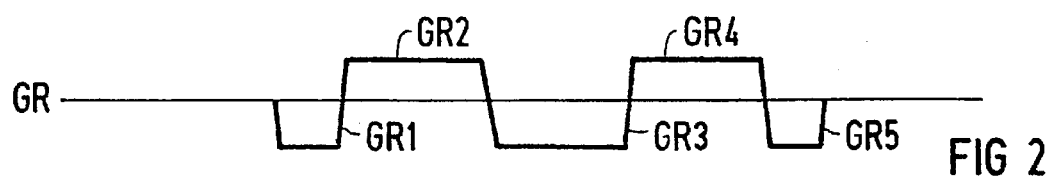
FIG. 2 shows the readout gradient GR employed in the inventive method.
Figure 5:
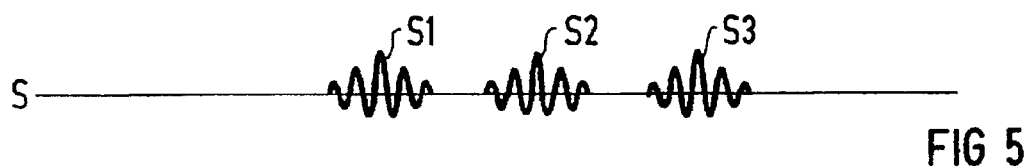
FIG. 5 shows the nuclear magnetic resonance signals S that are read out in the inventive method.

FIG. 2 shows the time curve of the readout gradient GR. As in the EPI method, this is multiply inverted, with the nuclear magnetic resonance signals S1, S2 and S3 according to FIG. 5 being read out under the sub-pulses GR2, GR3 and GR4 in the exemplary embodiment. A negative sub-pulse GR5 or GR1 ensues before and after every radiofrequency pulse RF, whereby the time integral of the readout gradient is zero over the repetition time TR for complete rephasing in readout direction:

$$\int_{TR} GR\, dt = 0$$

Figure 3:
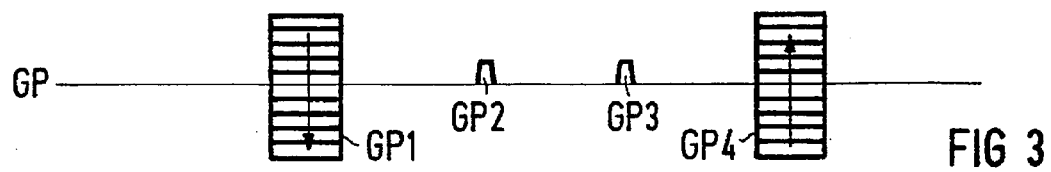
FIG. 3 shows the phase-encoding gradient GP employed in the inventive method.

FIG. 3 shows the time curve of the phase-coding gradient GP. Due to the short repetition time TR, the complete k-space cannot be sampled within this repetition time, but only a segment thereof. Typically, the k-space or raw data matrix produced for image data acquisition comprises 256 or 512 rows, thus a corresponding number of nuclear magnetic resonance signals with different phase coding must be acquired. In the exemplary embodiment, three signals S1 through S3 are acquired within a repetition time TR, i.e. the sequence must be repeated an appropriate number of times for acquiring a complete raw data matrix.

In the exemplary embodiment according to FIG. 3, a common phase-encoding gradient GP1 precedes the signals S1 through S3, which determines the segment of the raw data matrix to which the following nuclear magnetic resonance signals S1 through S3 are allocated. The amplitude of the phase-encoding gradient GP1 changes from sequence repetition-to-sequence repetition. As a result of short gradient pulses GP2 and GP3 respectively before the nuclear magnetic resonance signal S2 or S3, the three nuclear magnetic resonance signals S1 through S3 are differently phase-encoded within a sequence repetition. The phase in the phase-encoding direction is in turn completely reset by a phase coding gradient GP4, so that $$\int_{TR} GP\, dt = 0$$

applies.

Figure 6:
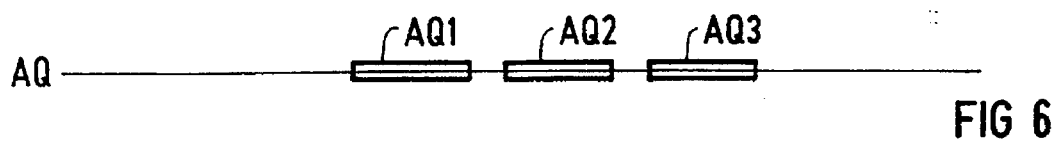
FIG. 6 shows the acquisition phases AQ employed in the inventive method.

The nuclear magnetic resonance signals S1 through S3 are sampled in acquisition phases AQ1 through AQ3 according to FIG. 6 and are digitized in a time grid. They are coded by the readout gradients GR in readout direction and by the phase-encoding gradients GP the in phase-coding direction and are allocated to a k-space matrix, or raw data matrix, according to the known relationships:

$$k_R(t) = \gamma \int_0^t GR(t')dt'$$

$$k_P(t) = \gamma \int_0^t GP(t')dt'$$

The readout time, that is counted beginning with every excitation (t=0), is referenced t.

Figure 7:
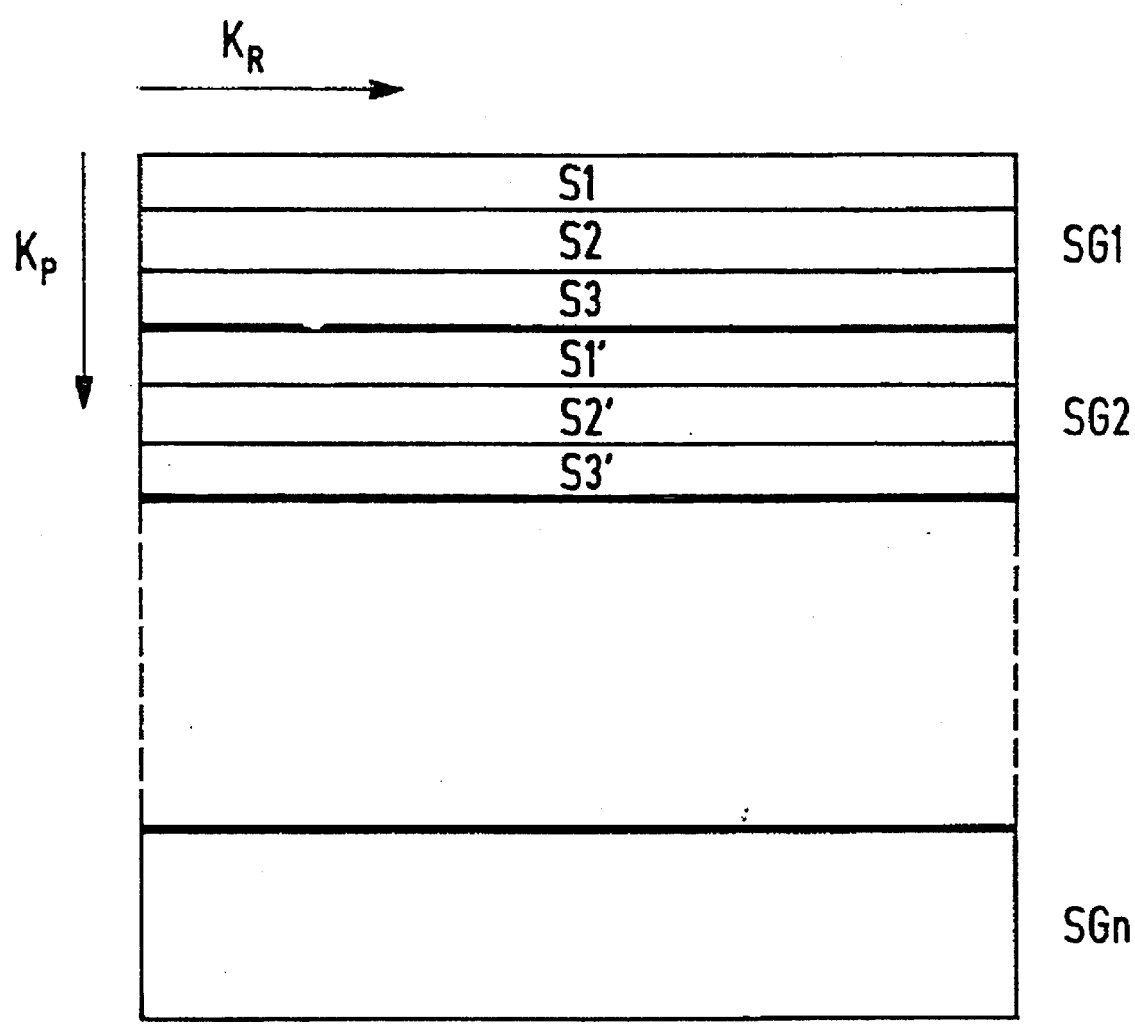
FIG. 7 shows the sorting of the nuclear magnetic resonance signals into a raw data matrix employed in the inventive method.

The raw data matrix RD is shown in FIG. 7. The samples of the three nuclear magnetic resonance signals S1 through S3 are classified line-by-line in each segment SG1 through SGn. As explained above, the allocation to the respective segment SG1 through SGn is determined by the phase-encoding gradient GP1 and the allocation to the rows within each segment is determined by the respective phase-encoding gradients GP2 or GP3.

Figure 4:
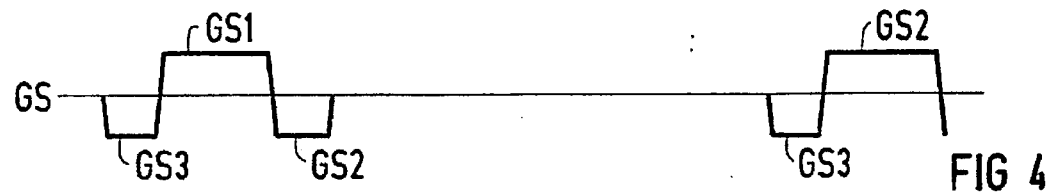
FIG. 4 shows the slice selection gradient GS employed in the inventive method.

FIG. 4 shows an exemplary embodiment of the slice selection gradient GS. In a conventional way, the positive part GS1 of the slice selection gradient GS1 causes each radiofrequency pulse RF to excite only nuclear spins within a specific slice. The width and the position of the selected slice is thereby defined by the frequency spectrum of the radiofrequency pulse RF in combination with the amount of the slice selection gradient GS1. In slice selection direction as well the phase must be completely reset before activation of the next radiofrequency pulse RF, i.e.

$$\int_{TR} GS\, dt = 0$$

must apply.

To this end, a negative sub-pulse GS2 or GS3 is applied before and after each positive sub-pulse GS1 of every slice selection gradient, these sub-pulses respectively comprising half the gradient time area of the positive sub-pulse, so that the aforementioned condition is met.

An image data matrix is produced from the raw data matrix in a conventional way such as, for example, in the standard FISP method.

Although various changes and modifications to the presently preferred embodiments described herein will be apparent to those skilled in the art, such changes and modifications can be made without departing from the spirit and scope of the present invention and without diminishing its intended advantages. Therefore, the appended claims are intended to cover such changes and modifications.

I claimed as my invention:

1. A method for operating a nuclear magnetic resonance tomography apparatus for obtaining a tomographic image of an examination subject disposed in an examination volume, comprising the steps of:

(a) generating a uniform magnetic field in said examination volume for aligning nuclear spins in said examination subject to a predetermined direction;

(b) exciting said nuclear spins in said examination subject by generating successive radiofrequency pulses with a repetition time which is shorter than a spin grid relaxation time of said nuclear spins and said repetition time having a duration for maintaining a phase difference during a repetition time, arising between nuclear spins in said examination subject due to magnetic field inhomogeneities, smaller than 180°;

(c) generating at least a readout gradient, composed of a plurality of sub-pulses with alternating polarity, between two successive radiofrequency pulses, with a nuclear magnetic resonance signal in the form of a gradient echo arising under each sub-pulse, and reading out at least a portion of the nuclear magnetic resonance signals in respective readout intervals; and (d) dimensioning any gradients generated between two successive radiofrequency pulses to have a gradient time integral of zero.

2. A method as claimed in claim 1 wherein step (b) is further defined by emitting each said radiofrequency pulse in the presence of a slice selection gradient which is symmetrical relative to a center of the radiofrequency pulse, comprising negative sub-pulses preceding and following said radiofrequency pulse and having said gradient time integral of zero.

3. A method as claimed in claim 1 comprising the additional step of differently phase-encoding each said nuclear magnetic resonance signal between two successive radiofrequency pulses.

4. A method as claimed in claim 3 wherein, for differently phase-encoding said nuclear magnetic resonance signals, a phase of the nuclear spins is advanced before each readout interval and the phase of the nuclear spins is reset to zero before a next radiofrequency pulse.

5. A method as claimed in claim 4 comprising generating a pre-phasing gradient in a phase-encoding direction after each radiofrequency pulse and changing said pre-phasing gradient from sequence repetition-to-sequence repetition so that a different region of k-space is sampled with each sequence repetition.

6. A method as claimed in claim 1 wherein the step of reading out at least a portion of said nuclear magnetic resonance signals comprises reading out at least a portion of said nuclear magnetic resonance signals under a sub-pulse of said readout gradient in a readout direction having a gradient-time area and generating a sub-pulse in said readout direction having one-half said gradient-time area before and after each radiofrequency pulse.

* * * * *